(12) United States Patent
Kilpi

(10) Patent No.: US 12,112,927 B2
(45) Date of Patent: Oct. 8, 2024

(54) SUBSTRATE PROCESSING APPARATUS AND METHOD

(71) Applicant: Picosun Oy, Espoo (FI)

(72) Inventor: Väinö Kilpi, Masala (FI)

(73) Assignee: PICOSUN OY, Espoo (FI)

( * ) Notice: Subject to any disclaimer, the term of this patent is extended or adjusted under 35 U.S.C. 154(b) by 0 days.

(21) Appl. No.: 17/734,572

(22) Filed: May 2, 2022

(65) Prior Publication Data

US 2022/0359170 A1   Nov. 10, 2022

(30) Foreign Application Priority Data

May 10, 2021   (FI) ...................................... 20215555

(51) Int. Cl.
| | |
|---|---|
| *C23C 16/44* | (2006.01) |
| *C23C 16/455* | (2006.01) |
| *C23C 16/458* | (2006.01) |
| *H01J 37/32* | (2006.01) |

(52) U.S. Cl.
CPC .... *H01J 37/32715* (2013.01); *C23C 16/4409* (2013.01); *C23C 16/45536* (2013.01); *C23C 16/45544* (2013.01); *C23C 16/4586* (2013.01); *H01J 37/32834* (2013.01); *H01J 37/3288* (2013.01); *H01J 37/32899* (2013.01); *H01J 37/3222* (2013.01); *H01J 2237/20235* (2013.01); *H01J 2237/332* (2013.01); *H01J 2237/3321* (2013.01); *H01J 2237/334* (2013.01); *H01J 2237/3341* (2013.01)

(58) Field of Classification Search
None
See application file for complete search history.

(56) References Cited

U.S. PATENT DOCUMENTS

| | | | |
|---|---|---|---|
| 3,749,662 A | 7/1973 | Biehl | |
| 6,499,425 B1 * | 12/2002 | Sandhu | ............. C23C 16/45574 156/345.44 |
| 2001/0011526 A1 | 8/2001 | Doering et al. | |
| 2005/0139321 A1 | 6/2005 | Higashiura | |
| (Continued) | | | |

FOREIGN PATENT DOCUMENTS

| | | |
|---|---|---|
| CN | 101171365 A | 4/2008 |
| EP | 0646285 B1 | 11/1998 |
| (Continued) | | |

OTHER PUBLICATIONS

Finnish Patent and Registration Office, Communication of Acceptance, U.S. Appl. No. 20/215,555, mailed Mar. 3, 2022, 4 pages.

(Continued)

*Primary Examiner* — Karla A Moore
(74) *Attorney, Agent, or Firm* — Espatent Oy

(57) ABSTRACT

A substrate processing apparatus (100), comprising a reaction chamber (50), an outer chamber (80) at least partly surrounding the reaction chamber (50) and forming an intermediate volume (70) therebetween, and a substrate support (40) within the reaction chamber (50), comprising a hollow inner volume (42), wherein the hollow inner volume (42) and the intermediate volume (70) are in fluid communication through a channel (45) extending from the hollow inner volume (42) to the intermediate volume (70).

10 Claims, 8 Drawing Sheets

(56) References Cited

U.S. PATENT DOCUMENTS

| | | | | |
|---|---|---|---|---|
| 2005/0268852 | A1* | 12/2005 | Hatanaka | C23C 16/45551 118/723 VE |
| 2009/0142933 | A1* | 6/2009 | Yajima | H01L 21/67017 438/758 |
| 2009/0239362 | A1* | 9/2009 | Hirata | H01L 29/0634 118/724 |
| 2009/0280248 | A1 | 11/2009 | Goodman et al. | |
| 2010/0039747 | A1 | 2/2010 | Sansoni et al. | |
| 2011/0005684 | A1 | 1/2011 | Hayami et al. | |
| 2012/0196242 | A1 | 8/2012 | Volfovski et al. | |
| 2013/0087286 | A1 | 4/2013 | Carducci et al. | |
| 2019/0067006 | A1 | 2/2019 | Hawrylchak et al. | |
| 2019/0341233 | A1 | 11/2019 | Nguyen et al. | |
| 2019/0341289 | A1 | 11/2019 | Parkhe | |
| 2019/0360100 | A1* | 11/2019 | Nguyen | C23C 16/505 |
| 2019/0390339 | A1* | 12/2019 | Malinen | C23C 16/458 |
| 2021/0066051 | A1 | 3/2021 | Babu et al. | |
| 2022/0359170 | A1* | 11/2022 | Kilpi | H01J 37/32816 |

FOREIGN PATENT DOCUMENTS

| | | |
|---|---|---|
| JP | 2004039844 A | 2/2004 |
| JP | 2020004954 A | 1/2020 |
| JP | 2021502704 A | 1/2021 |
| KR | 1020050119789 A | 12/2005 |
| KR | 101281124 B1 * | 7/2013 |
| KR | 1020160124006 A | 10/2016 |
| KR | 1020210002108 A | 1/2021 |
| WO | 2012136875 A1 | 10/2012 |
| WO | 2018146370 A1 | 8/2018 |
| WO | 2019094481 A1 | 5/2019 |
| WO | 2020149721 A1 | 7/2020 |
| WO | 2020260742 A1 | 12/2020 |

OTHER PUBLICATIONS

Finnish Patent and Registration Office, Search Report, Application No. 202155555, mailed Jun. 30, 2021, 2 pages.
Finnish Patent and Registration Office, Communication of Acceptance, U.S. Appl. No. 20/215,555, mailed Dec. 3, 2021, 4 pages.
Korea Patent Office, Notice of Comment, Application No. 10-2022-0055461, Mailed Sep. 28, 2022, 24 pages.
International Search Report, Application No. PCT/FI2022/050314, Mailed Aug. 17, 2022, 5 pages.
Japan Patent Office, Notification of Ground of Rejection, Application No. 2022071231, Mailed Jul. 12, 2022, 3 pages.
Intellectual Property Office, Korea, Written Decision on Registration, Application No. 10-2022-0055461, dated Feb. 22, 2023, 2 pages.
China Patent Office, First Office Action, Application No. 2022104838205, Mailed Aug. 15, 2023, 4 pages.
China Patent Office, Search Report, Application No. 2022104838205, Mailed Aug. 3, 2023, 3 pages.

* cited by examiner

901. Detaching reaction chamber assembly from bottom structure

902. Moving wirings and plugs via bottom structure openings

903. Lifting assembly up and moving away for maintenance

Fig. 9

1001. Detaching feedthrough part from bottom structure

1002. Moving wirings and plugs via bottom structure openings

1003. Moving wirings and plugs and feedthrough part through channel in pedestal leg 1004. Lifting substrate table up and moving away together with wirings, plugs, and feedthrough part suspended therefrom

Fig. 10

SUBSTRATE PROCESSING APPARATUS AND METHOD

FIELD OF THE INVENTION

The present invention generally relates to substrate processing apparatus and a method. More particularly, but not exclusively, the invention relates to chemical deposition or etching reactors.

BACKGROUND OF THE INVENTION

This section illustrates useful background information without admission of any technique described herein representative of the state of the art.

In chemical deposition or etching reactors, the processed substrate or substrates are supported by a substrate support. The substrate support typically requires wirings and tubings, however, the positioning of these wirings and tubings within the apparatus make them difficult to reach in order to be able to clean them and perform standard maintenance, thereby negatively impacting on maintenance downtime.

SUMMARY

It is an object of certain embodiments of the invention to provide a substrate processing apparatus and a method for ameliorating the maintenance of the apparatus or at least to provide an alternative solution to existing technology.

According to a first example aspect of the invention there is provided a substrate processing apparatus, comprising:
 a reaction chamber;
 an outer chamber at least partly surrounding the reaction chamber and forming an intermediate volume therebetween; and
 a substrate support within the reaction chamber, comprising a hollow inner volume, wherein the hollow inner volume and the intermediate volume are in fluid communication through a channel extending from the hollow inner volume to the intermediate volume.

In certain embodiments, the intermediate volume and the hollow inner volume of the substrate support form a shared pressure space through the channel at the substrate processing stage of the apparatus. In certain embodiments, the number of channels is more than one, such as three.

In certain embodiments, the channel extends through a feedthrough in a reaction chamber wall. In certain embodiments, the substrate support comprises a protrusion housing the channel extending from the hollow inner volume to the feedthrough in the reaction chamber wall.

In certain embodiments, an inner volume of the reaction chamber surrounds the channel.

In certain embodiments, the intermediate volume is sealed off (or isolated) from the substrate processing space of the reaction chamber during a substrate processing phase.

In certain embodiments, the hollow inner volume is at the pressure of the intermediate volume, the channel forming a flow connection in between the said volumes. In certain embodiments, the said channel is surrounded by a pressure region that has a reaction chamber pressure. In certain embodiments, the reaction chamber has a pressure that is lower than a pressure within the intermediate space during substrate processing.

In certain embodiments, the substrate support comprises a detachably attached or attachable substrate table.

In certain embodiments, the substrate support comprises wirings extending from the hollow inner volume of the substrate support through the channel into the intermediate volume and therefrom to the outside of the outer chamber.

In certain embodiments, the channel houses wirings which wirings extend within the channel from the substrate support to the intermediate volume.

In certain embodiments, the wirings further extend to outside of the outer chamber from the intermediate volume to the outside of the outer chamber.

In certain embodiments, the substrate support comprises a substrate table and a pedestal (or bottom cover). In certain embodiments, the pedestal comprises one or more pedestal legs supporting the pedestal against a supporting structure (e.g. against the reaction chamber). In certain embodiments, one pedestal leg provides the said channel (or a plurality of channels may be provided in case more than one (or each) pedestal leg comprises a channel).

In certain embodiments, the wirings exit the outer chamber through at least one feedthrough at the bottom of the outer chamber.

In certain embodiments, at least one feedthrough part is detachably attached or attachable to a bottom flange of the outer chamber. In certain embodiments, at least one feedthrough part is detachably attached or attachable to a connection flange attached to a reaction chamber assembly.

In certain embodiments, at least one feedthrough part is detachably attached or attachable to a connection flange of an assembly comprising at least a lower part of the reaction chamber and the substrate support.

In certain embodiments, the at least one feedthrough part is detachably attached or attachable to the bottom flange of the intermediate volume by at least one fastener releasable from above or from below. In certain embodiments, the at least one feedthrough part is a vacuum flange whose outer diameter is smaller than the inner diameter of the channel.

In certain embodiments, the connection flange is detachably attached or attachable to a bottom flange of the outer chamber.

In certain embodiments, the connection flange of the intermediate volume is detachably attached or attachable to the bottom flange of the outer chamber by at least one fastener releasable from above or from below.

In certain embodiments, the apparatus comprises a reaction chamber exhaust line commencing at the bottom of a reaction chamber bowl. In certain embodiments, the exhaust line exits the outer chamber through the bottom of the outer chamber.

In certain embodiments, the exhaust line is symmetrically positioned below the reaction chamber around a rotational symmetry axis of the reaction chamber. In certain embodiments, the exhaust line travels centrally through the bottom flange of the outer chamber (and centrally through the (optional) connection flange).

In certain embodiments, the apparatus comprises an actuator configured to lower and raise the reaction chamber, and a longitudinally (vertically) extensional tubular (tube) part in a reaction chamber exhaust line allowing a vertical movement.

In certain embodiments, the said allowing a vertical movement is implemented by allowing vertical contraction and extension of the exhaust line.

In certain embodiments, the apparatus comprises wirings (e.g., a bundle of electrical wires) wound or spiraled around the longitudinally extensional tubular part.

In certain embodiments, the apparatus is configured to adjust a vertical position of the substrate support by extending a length of the channel. In certain embodiments, the substrate support is formed of a top part or a substrate table and a pedestal (bottom part or bottom cover) beneath the substrate table. In certain embodiments, the pedestal comprises legs that form the said channels. In certain embodiments, the number of legs is at least one. In certain embodiments, the number of legs is at least two. In certain embodiments, the number of legs is three or more. In certain embodiments, the legs are symmetrically positioned.

In certain embodiments, the apparatus comprises an actuator configured to lower and raise a level of a substrate table comprised by substrate support by changing a longitudinal dimension of a longitudinally extensional part that forms part of the channel. Accordingly, in certain embodiments, the apparatus comprises an actuator configured to adjust the length of the pedestal legs. In certain embodiments, the longitudinally (or vertically) extensional part that forms the channel (or the pedestal leg) is implemented by a bellows (or vacuum bellows) or by nested sub parts, for example two or more nested tubular parts of different diameter which may be moved vertically inside each other. In that way a contracted shape and extended shapes of the longitudinally extensional part can be realized so as to provide different vertical positions of the substrate support (or support table).

In certain embodiments, the apparatus comprises antennas for plasma formation positioned within the reaction chamber above the substrate support. In certain embodiments, the antennas are radiation transmitting antennas of a plasma applicator. In certain embodiments, the radiation transmitting antennas are located within a hollow inner volume provided by the reaction chamber. In certain embodiments, both the antennas and the substrate support are located within the same hollow inner volume (or both the antennas and the substrate to be processed are configured to be located within the same hollow inner volume).

In certain embodiments, the apparatus comprises precursor pipes extending into spaces in between the antennas and further within the reaction chamber to discharge non-plasma gas at points downstream from the antennas. In certain embodiments, the apparatus further comprises plasma gas inlets providing a plasma gas flow from above the antennas via spaces in between the antennas to below the antennas. The antennas may be positioned within covering tubes. During plasma treatment, the plasma ignites when plasma gas passes the antennas. Formed plasma species flow downwards towards the substrate support, i.e., towards the substrate(s).

According to a second example aspect of the invention there is provided a substrate processing apparatus, comprising:
  a reaction chamber;
  an outer chamber at least partly surrounding the reaction chamber and forming an intermediate volume therebetween; and
  a substrate support within the reaction chamber, wherein the substrate support is fixed to a wall of the reaction chamber, and the substrate support together with the reaction chamber are vertically movable by contracting and extending an exhaust line connected to a bottom of the reaction chamber.

According to a third example aspect of the invention there is provided a method for disassembling a substrate processing apparatus that comprises a reaction chamber, an outer chamber at least partly surrounding the reaction chamber and forming an intermediate volume therebetween, and a substrate support within the reaction chamber, the method comprising:

detaching a reaction chamber assembly comprising the substrate support and a lower part of the reaction chamber from a bottom structure of the outer chamber;
  moving wirings and their plugs suspended from the substrate support from an outside of the outer chamber to the intermediate volume through respective opening(s) arranged in the bottom structure; and
  lifting up and removing the reaction chamber assembly, including the suspended wirings and their plugs, from the apparatus for maintenance.

In certain embodiments, the bottom structure comprises a bottom flange of the outer chamber. In certain embodiments, the detaching is performed by releasing respective fasteners from an ambient pressure side of the bottom structure.

In certain embodiments, the expression "wirings and plugs" comprises in addition to electrical wires and their plugs also applicable tubing(s) for fluid and their connector(s).

In certain embodiments, said detaching of the reaction chamber assembly comprises detaching a connection flange of the reaction chamber assembly from the bottom structure of the outer chamber.

In certain embodiments, the connection flange is attached to an exhaust line extending downwards from the reaction chamber bowl. In certain embodiments, the exhaust line comprises a flexible and/or longitudinally extendable tubular part, such as a vacuum bellows, and a stationary part beneath the flexible and/or longitudinally extendable tubular part. In certain embodiments, the connection flange is attached to the stationary part of the exhaust line.

In certain embodiments, said detaching a connection flange comprises detaching, from the bottom structure, a sealing feedthrough part sealing the said openings arranged in the bottom structure.

Different non-binding example aspects and embodiments have been illustrated in the foregoing. The above embodiments are used merely to explain selected aspects or steps that may be utilized in implementations of the present invention. Some embodiments may be presented only with reference to certain example aspects. It should be appreciated that corresponding embodiments apply to other example aspects as well. In particular, the embodiments described in the context of the first aspect are applicable to each further aspect, and vice versa. Any appropriate combinations of the embodiments may be formed.

BRIEF DESCRIPTION OF THE DRAWINGS

The invention will now be described, by way of example only, with reference to the accompanying drawings, in which:

FIG. 9 shows a flow chart of a method for disassembling a substrate processing apparatus for maintenance in accordance with certain embodiments; and FIG. 10 shows a flow chart of another method for disassembling the substrate processing apparatus for maintenance in accordance with certain other embodiments.

DETAILED DESCRIPTION

Figure 1:
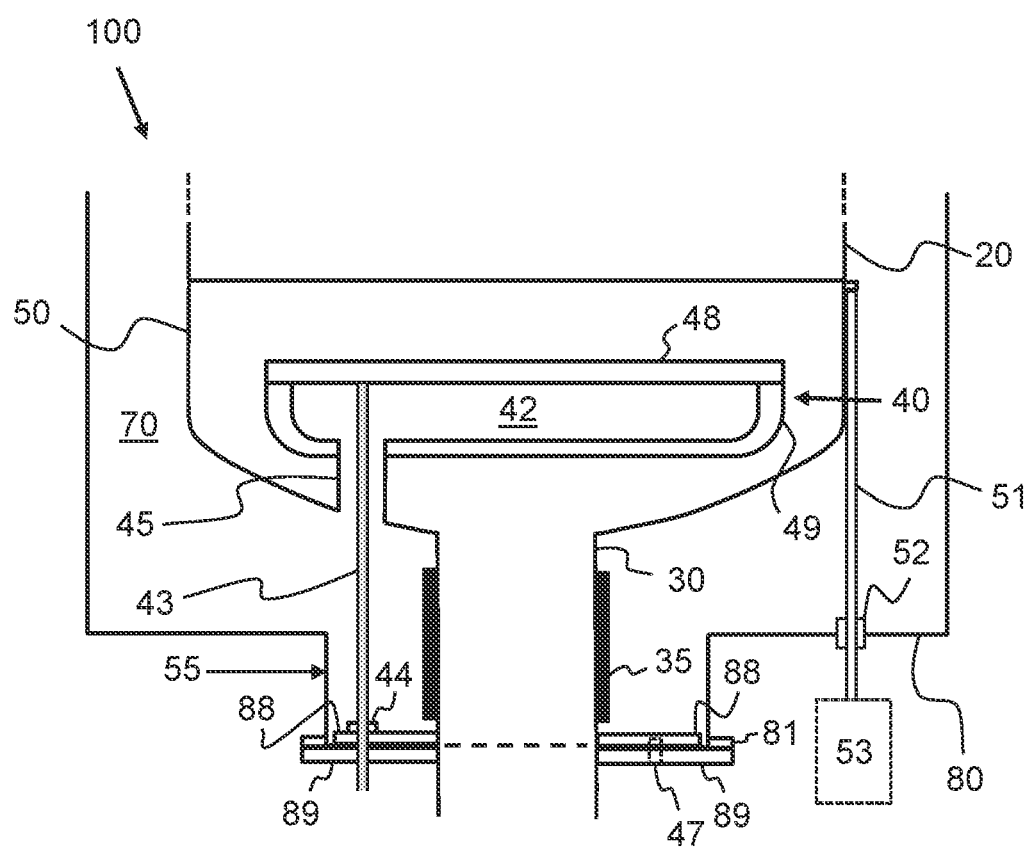
FIG. 1 shows a schematic cross section of a substrate processing apparatus in a substrate processing stage in accordance with certain embodiments.

In the following description, Atomic Layer Deposition (ALD) technology and Atomic Layer Etching (ALE) technology are used as an example.

The basics of an ALD growth mechanism are known to a skilled person. ALD is a special chemical deposition method based on sequential introduction of at least two reactive precursor species to at least one substrate. A basic ALD deposition cycle consists of four sequential steps: pulse A, purge A, pulse B and purge B. Pulse A consists of a first precursor vapor and pulse B of another precursor vapor. Inactive gas and a vacuum pump are typically used for purging gaseous reaction by-products and the residual reactant molecules from the reaction space during purge A and purge B. A deposition sequence comprises at least one deposition cycle. Deposition cycles are repeated until the deposition sequence has produced a thin film or coating of desired thickness. Deposition cycles can also be either simpler or more complex. For example, the cycles can include three or more reactant vapor pulses separated by purging steps, or certain purge steps can be omitted. Or, as for plasma-assisted ALD, for example PEALD (plasma-enhanced atomic layer deposition), or for photon-assisted ALD, one or more of the deposition steps can be assisted by providing required additional energy for surface reactions through plasma or photon in-feed, respectively. Or one of the reactive precursors can be substituted by energy, leading to single precursor ALD processes. Accordingly, the pulse and purge sequence may be different depending on each particular case. The deposition cycles form a timed deposition sequence that is controlled by a logic unit or a microprocessor. Thin films grown by ALD are dense, pinhole free and have uniform thickness.

As for substrate processing steps, the at least one substrate is typically exposed to temporally separated precursor pulses in a reaction vessel (or chamber) to deposit material on the substrate surfaces by sequential self-saturating surface reactions. In the context of this application, the term ALD comprises all applicable ALD based techniques and any equivalent or closely related technologies, such as, for example the following ALD sub-types: MLD (Molecular Layer Deposition), plasma-assisted ALD, for example PEALD (Plasma Enhanced Atomic Layer Deposition) and photon-assisted or photon-enhanced Atomic Layer Deposition (known also as flash enhanced ALD or photo-ALD).

However, the invention is not limited to ALD technology, but it can be exploited in a wide variety of substrate processing apparatuses, for example, in Chemical Vapor Deposition (CVD) reactors, or in etching reactors, such as in Atomic Layer Etching (ALE) reactors.

The basics of an ALE etching mechanism are known to a skilled person. ALE is a technique in which material layers are removed from a surface using sequential reaction steps that are self-limiting. A typical ALE etching cycle comprises a modification step to form a reactive layer, and a removal step to take off only the reactive layer. The removal step may comprise using a plasma species, ions in particular, for the layer removal. The source of plasma species can be varied, with a plasma applicator providing a source of plasma over a relatively large area being preferred. Plasma applicators may include a plasma array, a hollow cathode or microwave plasma, for example.

In context of ALD and ALE techniques, the self-limiting surface reaction means that the surface reactions on the reactive layer of the surface will stop and self-saturate when the surface reactive sites are entirely depleted.

FIG. 1 shows a schematic cross section of a substrate processing apparatus 100 in a substrate loading stage in accordance with certain embodiments. The substrate processing apparatus 100 may be, for example, an ALD reactor or an ALE reactor. The apparatus 100 comprises a reaction chamber 50, and an outer chamber 80 (or vacuum chamber) at least partly surrounding the reaction chamber 50. An intermediate volume 70 (or intermediate space) is formed between the reaction chamber 50 and the outer chamber 80. In certain embodiments, the intermediate volume 70 is formed within the outer chamber 80 on the outside of the reaction chamber 50 so that the intermediate volume 70 is defined by both an outer chamber wall and a reaction chamber wall and, accordingly, is formed therebetween.

The apparatus 100 further comprises a substrate support 40 within the reaction chamber 50. The substrate support 40 comprises a hollow inner volume 42. In certain embodiments, a substrate table 48 (or wafer table) forms a top part of the substrate support 40. The support 40 further comprises a bottom part or pedestal 49 beneath the substrate table 48. The substrate support 40 may include one, two, three or more pedestal legs around the base of a substantially circular bowl. In certain embodiments, there are three pedestal legs arranged substantially equidistant on the circular bowl. In certain embodiments, the hollow inner volume 42 is formed between the substrate table 48 and the pedestal 49. In certain embodiments, the hollow inner volume 42 resides beneath the substrate table 48.

The reaction chamber 50 comprises a process gas space. The process gas space is the volume within the reaction chamber 50 in which process gases flow during a substrate processing stage (while the substrate lies on or above the substrate table 48). In certain embodiments, the hollow inner volume 42 is isolated from the process gas space. The pedestal 49 comprises a channel 45 extending from the hollow inner volume 42 to the intermediate volume 70 such that said volumes 42, 70 are in fluid communication. In certain embodiments, the channel 45 is surrounded by the process gas space of the reaction chamber 50 (but there is no flow connection from the channel 45 to the process gas space during processing). In certain embodiments, the volume 42 extends along the channel 45 to the reaction chamber wall and therethrough into the intermediate volume 70. Accordingly, in certain embodiments, the intermediate volume 70 continues inside the reaction chamber 50 into the volume 42, however as being isolated from the process gas space of the reaction chamber 50. In certain embodiments, the intermediate volume 70, channel 45 and the volume 42 are in fluid communication (so as to form a continuous volume) having a common (same or at least similar) pressure. In certain embodiments, the channel 45 is substantially vertically oriented. In certain embodiments, the apparatus comprises a plurality of the described channels 45, for example, three channels. In certain embodiments, the channels 45 are implemented by pedestal legs that optionally connect the pedestal part 49 to reaction chamber wall(s).

The volume 42 houses various wirings 43 (for example, electric cables, heater and sensor wires, and tubings for gas and/or liquid, such as protective gas, optional coolants, etc.) as required by the substrate table 48. These wirings 43 are guided though the channel 45 from the volume 42 to the intermediate volume 70. The wall of the outer chamber 80 can withstand different pressures on either side of the wall, for example, the pressure could be a vacuum pressure or an ambient pressure. In certain embodiments, the intermediate volume 70 is in vacuum during substrate processing while the volume on the outside of the outer chamber 80 is at (higher) ambient pressure, or at room pressure.

The apparatus 100 comprises at least one feedthrough part 44 for guiding the wirings 43 from the substrate table 48 through the intermediate volume 70 to the outside of the outer chamber 80. In certain embodiments, the feedthrough part 44 is attached to a wall structure of the outer chamber 80, preferably a bottom structure of outer chamber 80. In certain embodiments, the wall structure is a bottom flange 89 of the outer chamber 80. In certain embodiments, there is a further flange on the bottom of the intermediate volume 70 (herein denoted as a connection flange 88). In certain embodiments, the said flanges 88, 89 are on top of each other and attached or attachable to each other. In certain embodiments the flanges 88, 89 are attached or attachable to each other by fasteners 47, for example bolt(s). In certain embodiments, the feedthrough part 44 extends through both flanges 88, 89.

In certain alternative embodiments, the at least one feedthrough part 44 is only attached to the flange 88.

In certain embodiments, as shown in FIG. 1, the structure of the outer chamber 80 is optionally such that it constricts towards a substantially central neck portion which forms a tubular volume (or part) 55 extending towards the bottom flange 89. The tubular volume 55 includes an exhaust line or foreline 30 extending from the reaction chamber 50 and passing through the bottom flange 89 (and connection flange 88) towards a vacuum pump (not shown).

In certain embodiments, a part of the exhaust line 30 is formed as a longitudinally extending (tubular) part 35. The part 35 has a contracted shape and an (or at least one) extended shape allowing a substantially vertical movement of the reaction chamber 50 residing on top of the exhaust line 30. The reaction chamber 50 may be a bowl-shaped part, or another (e.g. cylindrical) part with rotational symmetry.

In certain embodiments, the part 35 is implemented by a vacuum bellows. In certain other embodiments, the part 35 is implemented by nested sub parts, for example two or more nested tubular parts of different diameter which may be moved vertically inside each other to realize the contracted and extended shape(s).

The connection flange 88 is in certain embodiments attached to the reaction chamber 50. In certain embodiments, this is achieved through the connection flange 88 being fixed to the exhaust line 30.

The bottom flange 89 of the outer chamber may rest on or be fixed to a main body of the outer chamber 80. In certain embodiments, the bottom flange 89 is attached to the main body 80 of the outer chamber at attachment points or region 81. In certain embodiments, the attachment points or region 81 are provided by a further flange (positioned e.g. at a bottom edge of the main body). In certain embodiments, the attachment points or region 81 circumvent the volume or part 55.

In certain embodiments, the apparatus comprises an actuator 53 comprising a force transmission element (or rod) 51 extending through an outer chamber feedthrough 52 and attaching to the reaction chamber 50 or its edge or outside wall.

In FIG. 1, the reaction chamber 50 contacts an upper counterpart (or countersurface) 20 (for example a lid system or a sidewall part) to seal the interior of the reaction chamber 50 from the intermediate volume 70 during substrate processing. At least one substrate may be positioned on or above the substrate table 48 (the substrate is not shown) to be processed for example by ALD or ALE under vacuum conditions.

Figure 2:
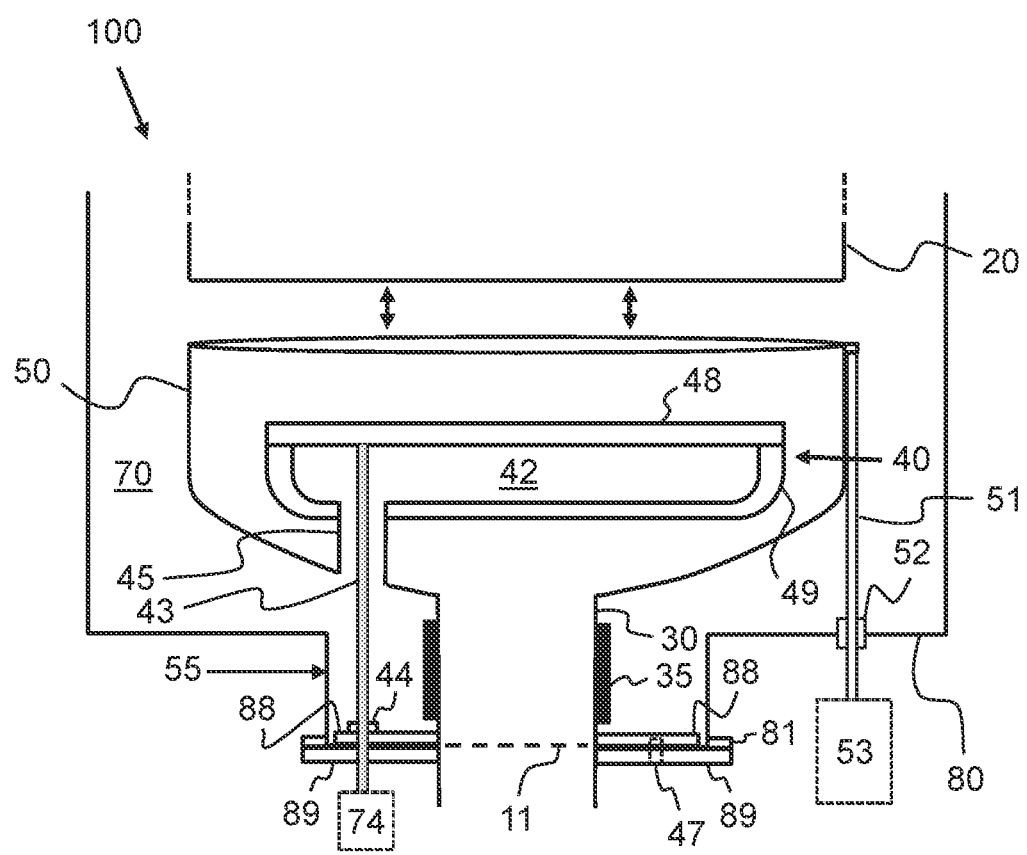
FIG. 2 shows a schematic cross section of the substrate processing apparatus of FIG. 1 in a substrate loading stage in accordance with certain embodiments.

FIG. 2 shows that the reaction chamber 50 can be moved from a first position for substrate processing to a second position for substrate loading by the actuator 53 and as allowed/permitted by a contracting/restricting movement of the exhaust line 30 due to the part 35. A loading gap has been formed, when the reaction chamber 50 is in the second position, between the counterpart 20 and the moveable reaction chamber 50 to allow for the loading and unloading of one or more substrates onto (before processing) and away (when processing is complete) from the substrate table 48. The substrate processing configuration of the reaction chamber 50 may be resumed by elevating the moving part of reaction chamber 50 back from the second position to the first position (as shown in FIG. 1). In certain embodiments, the wirings 43 at the area of the longitudinally extending part 35 is set in spiral to facilitate the vertical movement of the moving reaction chamber 50.

The feedthrough part 44 provides for a sealed feedthrough for the wirings 43 from the vacuum pressure region to the ambient pressure region. In certain embodiments, the feedthrough part 44 is implemented by a vacuum flange, for example, a KF16 vacuum flange. The wirings (e.g. wires or cables which are sheathed, advantageously metal sheathed, and/or tubular conduits) 43 are attached to the feedthrough part 44, for example by brazing.

In certain embodiments, there are a plurality of feedthrough parts 44 attached to the wall structure (or bottom structure) of the outer chamber 80, for example, at least three feedthrough parts 44. In certain embodiments, each feedthrough part 44, for example three of those, provides a feedthrough for a plurality of wires or tubular conduits. In certain embodiments, the bottom structure has one feedthrough part 44 per pedestal leg.

In certain embodiments, the feedthrough parts (or at least one feedthrough part) 44 are detachably attached to the wall structure (or bottom structure) by fasteners that are openable from the outside of vacuum (e.g., from the ambient pressure side of the wall structure) or from the vacuum pressure side in some embodiments. In certain such embodiments, the at least one feedthrough part 44 is detachably attached to flange 88 by at least one fastener openable from below or from above. In certain embodiments, the dimensions of the at least one feedthrough part 44 is so small that it fits through the channel 45. In that way the substrate table 48 can be disassembled from the rest of the substrate support 40 (from a bottom cover or pedestal 49), lifted upwards (the at least one feedthrough part 44 passing through the channel 45 and hanging (or suspended) from the wirings 43) and transported away from the apparatus 100 for service (for example, via the substrate loading gap). On the outside of the outer chamber 80 (on the outside of the vacuum) the wirings 43 in certain embodiments comprise electric plugs and/or (quick) connectors 74 for gas/fluid conduits further facilitating the disassembly.

Furthermore, in certain embodiments, the horizontal dimensions of the bottom flange 88 are smaller than the horizontal dimensions of the tubular volume or part 55. The bottom flange 88 fastened by fasteners that are openable from the outside of vacuum (from below of the outer chamber 80) or from above in certain embodiments may therefore be released by opening the fasteners, and the whole package of the reaction chamber (bowl) 50, substrate support 40 comprising the substrate table 48 and attached to the reaction chamber (bowl) 50, bottom flange 88, the feedthrough part(s) 44 and related wirings 43, as well as the exhaust line up to and optionally including the part 35 can be lifted upwards. In this manner the whole package can be removed from the apparatus 100 from the top for service (a detaching level is depicted by line 11 in FIG. 2).

Figure 3:
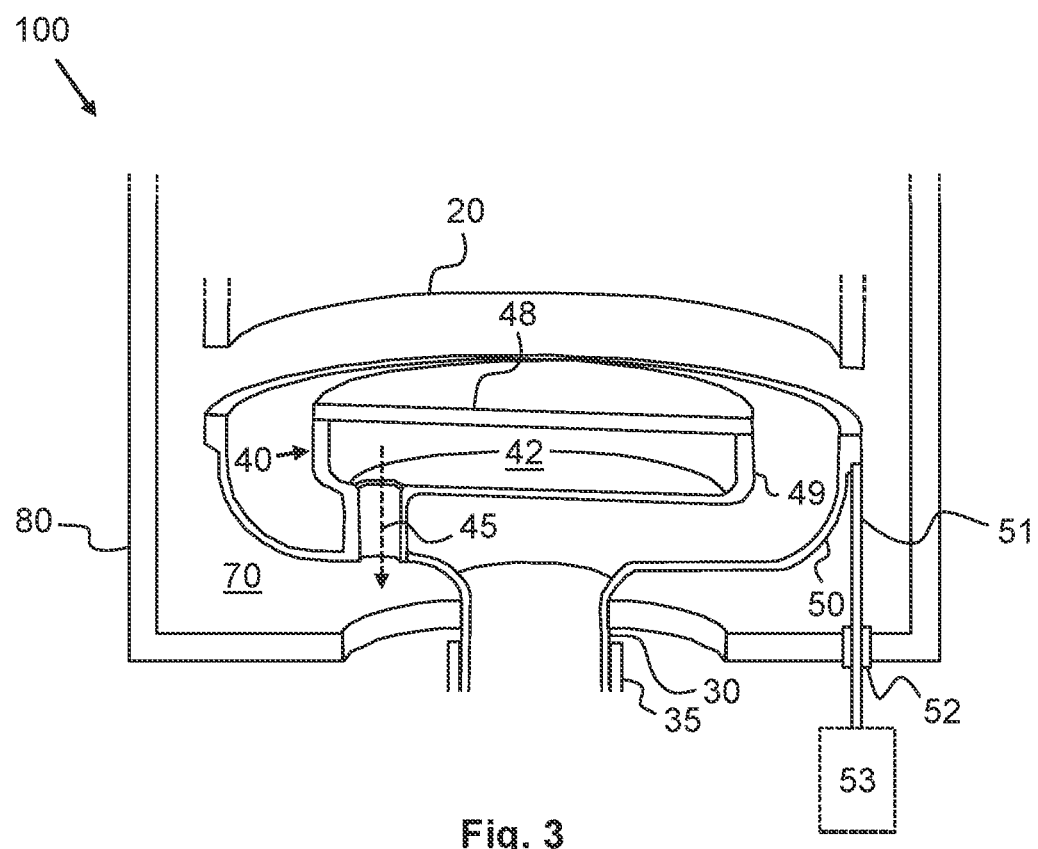
FIG. 3 shows a further cross-sectional view of the substrate processing apparatus of FIG. 1 in a substrate processing stage in accordance with certain embodiments.

FIG. 3 shows a further cross-sectional view of the substrate processing apparatus 100 in a substrate processing stage in accordance with certain embodiments.

Figure 4:
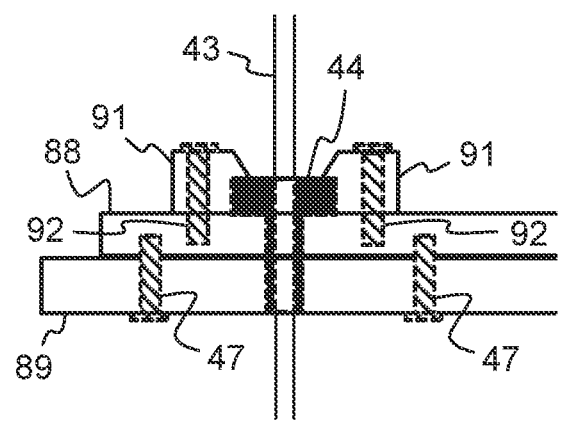
FIG. 4 shows a certain detail of the apparatus in accordance with certain embodiments.

FIG. 4 shows a certain detail of the apparatus 100 in accordance with certain embodiments. In more detail, the FIG. 4 shows one method for attaching the feedthrough part 44 into the wall structure of the outer chamber 80. The part 44 is pressed against the connection flange 88 by fixing elements 91 which are fastened by fasteners 92 positioned into (threaded) holes that extend into flange 88. Further fasteners 47 optionally extend through flange 89 into flange 88, which fasteners 47 may be released from the outside of the outer chamber 80 thereby enabling the package comprising the reaction chamber 50 and the substrate support 40 to be releasably removed from the apparatus 100 for maintenance.

In certain embodiments, as mentioned in the preceding, the flange 89 is attached to the outer chamber 80 but the flange 88 is attached to the substrate bowl wafer table package to which the part 44 is connected. The parts 44 and 88 are connected with fasteners (or bolts) 92 from the inside (of the intermediate space 70) while the parts 88 and 89 are connected with fasteners (or bolts) 47 from the outside (of the outer chamber 80).

In further embodiments, the fasteners 92 extend via the flange 88 into the flange 89. In certain such embodiments, the fasteners 47 may be omitted.

Figure 5:
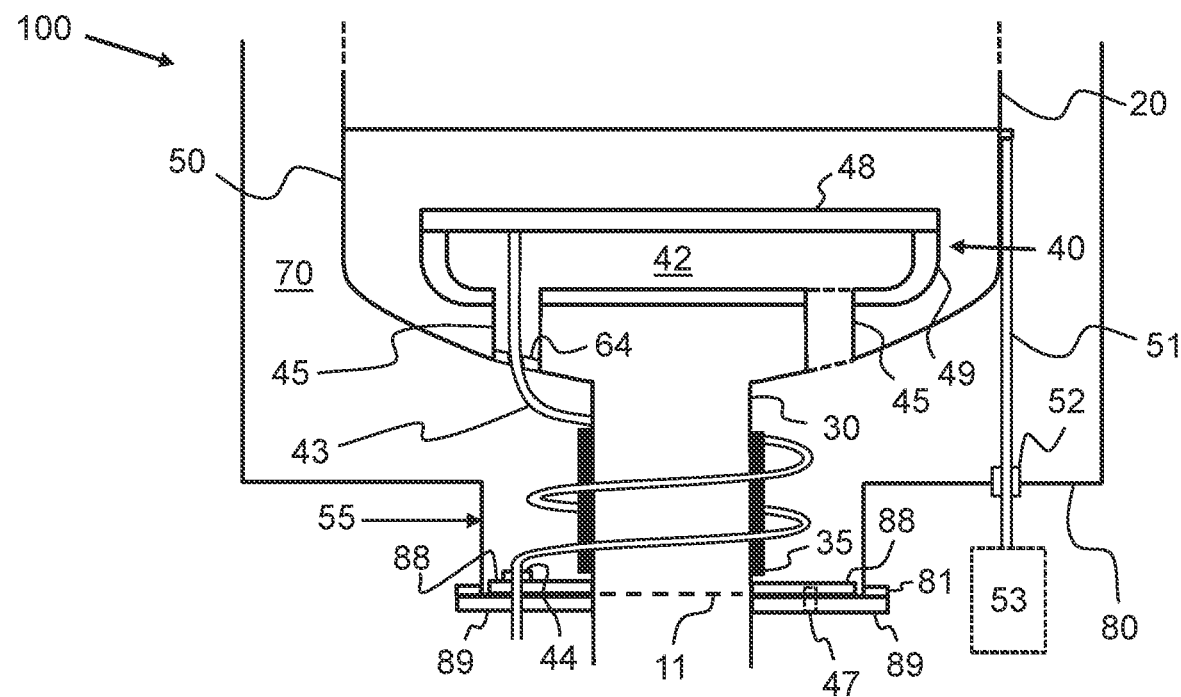
FIG. 5 shows an alternative embodiment of the substrate processing apparatus with wirings wound around an exhaust channel.

In certain embodiments, the wirings 43 are in the spiral form on the vacuum pressure side of the flanges 88, 89 to facilitate the vertical movement of the vacuum chamber 50. An example of this is shown in FIG. 5 depicting the wiring 43 wound (or spiraled) around the longitudinally extensional tubular part 35. In certain embodiments, the wirings are attached to the pedestal 49 by a fitting part 64.

Figure 6:
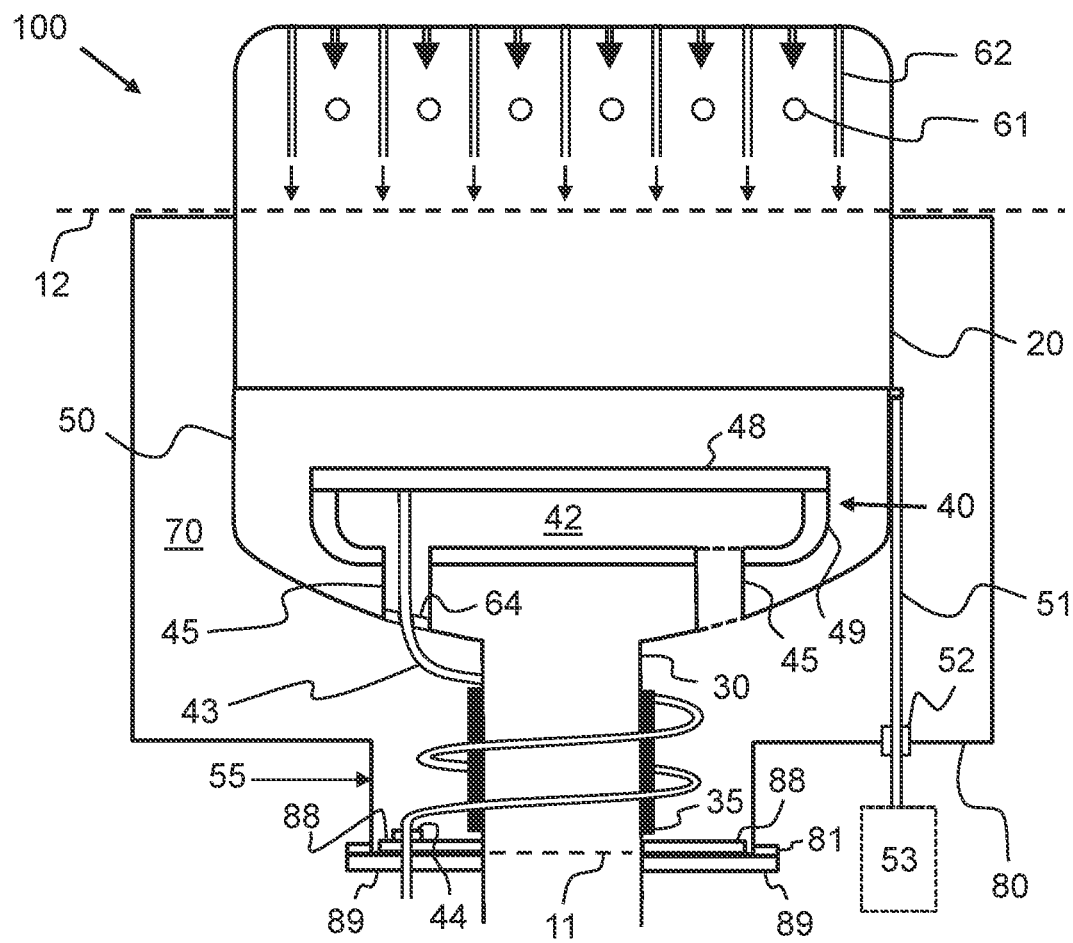
FIG. 6 shows a cross sectional view of the substrate processing apparatus with a plasma source included in accordance with certain embodiments.

In certain embodiments, as shown in FIG. 6, the apparatus 100 comprises antennas for plasma formation positioned within the reaction chamber 50 above the substrate support 40. In certain embodiments, the antennas are radiation transmitting antennas 61 of a plasma applicator. In certain embodiments, both the antennas 61 and the substrate support 40 are located within the same volume (or both the antennas 61 and the substrate to be processed are configured to be located within the same volume).

In certain embodiments, the apparatus 100 comprises precursor pipes 62 extending into spaces in between the antennas 61 and further within the reaction chamber 50 to discharge non-plasma gas at points downstream from the antennas 61. In certain embodiments, the apparatus 100 further comprises plasma gas inlets providing a plasma gas flow from above the antennas 61 via spaces in between the antennas to below the antennas 61. In certain embodiments, the antennas 61 are positioned within covering tubes. During plasma treatment, the plasma ignites when plasma gas passes the antennas 61. Formed plasma species flow downwards towards the substrate support 40, i.e., towards the substrate(s).

In certain embodiments, the plasma applicator comprising the antennas 61 is attached to an upper counterpart of countersurface 20 (which counterpart may be a lid or lid system, which in certain embodiments is common for both chambers 50 and 80). In certain embodiments, the lid or lid system is movable. The dashed line 12 in FIG. 6 shows a level at which the movable lid or lid system is openable in certain embodiments.

In certain embodiments, the source of plasma species can be varied, with a plasma applicator providing a source of plasma over a relatively large area being preferred. Plasma applicators may include a plasma array (such as shown in FIG. 6), a hollow cathode or microwave plasma, for example.

Figure 7:
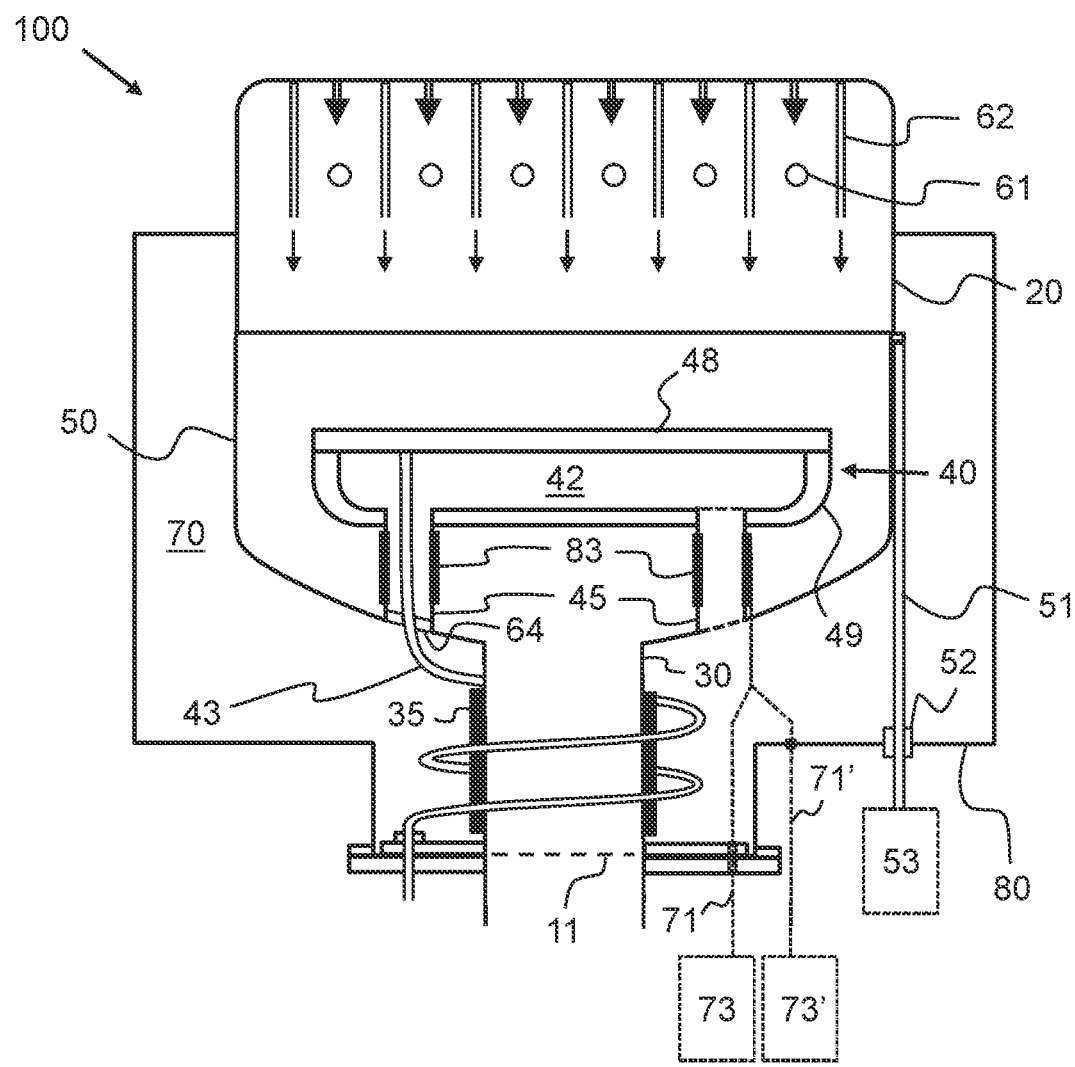
FIG. 7 shows an alternative embodiment of the substrate processing apparatus with adjustable substrate holder pedestal legs in their contracted configuration.
Figure 8:
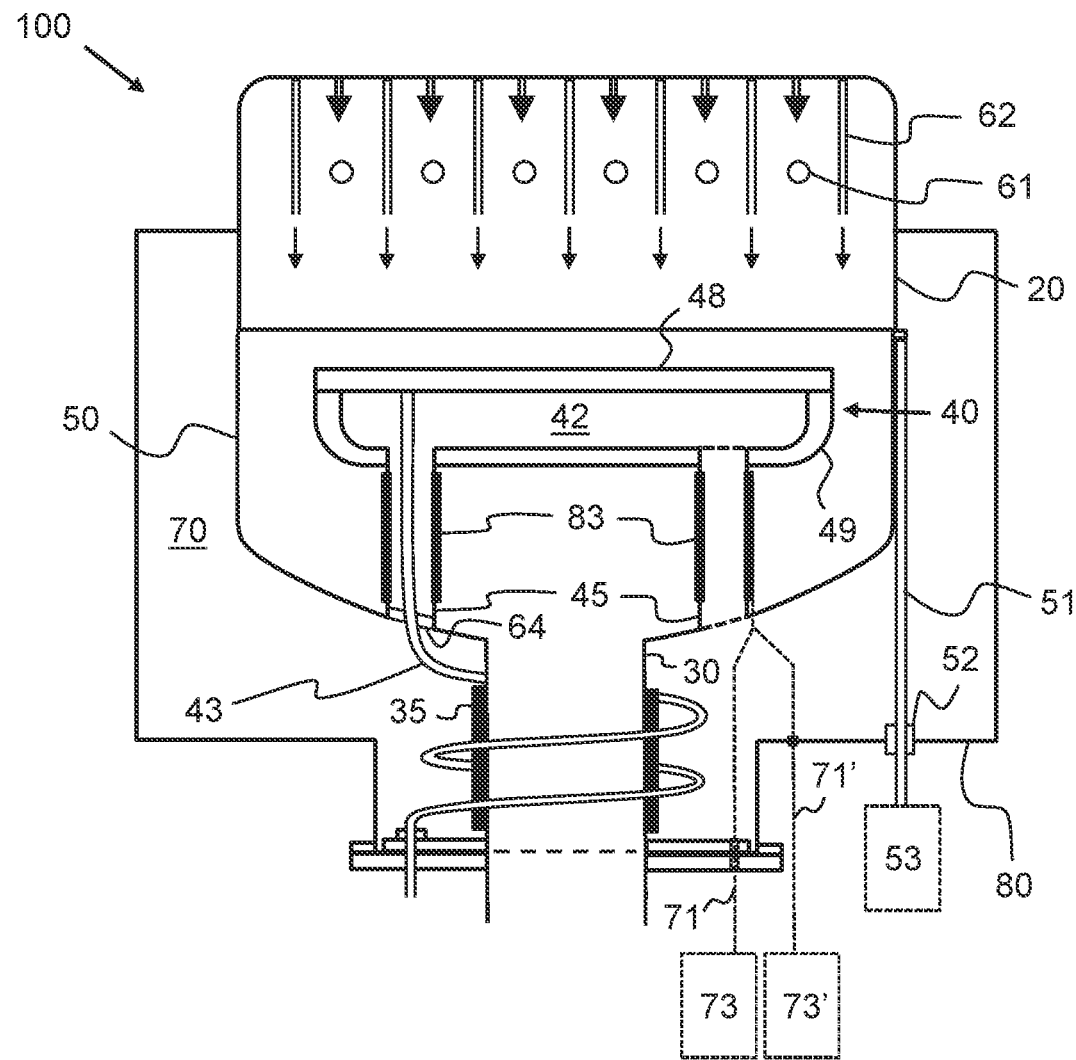
FIG. 8 shows the substrate processing apparatus of FIG. 7 with the pedestal legs in their extended configuration.

In certain embodiments, the apparatus 100 is configured to adjust a vertical position of the substrate support 40, or in particular, a vertical position of the substrate table 48 within the reaction chamber 50 irrespective of the movement of the reaction chamber 50. For this purpose, the apparatus 100 comprises an actuator which is configured to change a longitudinal dimension of a pedestal 49 leg (i.e., to lengthen or shorten the pedestal 49 leg including the channel 45). In certain embodiments, a longitudinally extensional part 83, as seen in FIG. 7, forms part of the channel 45. The longitudinally (or vertically) extensional part that forms the channel (or the pedestal leg) 45 is implemented for example by a bellows (or vacuum bellows) or for example by nested sub parts, such as two or more nested tubular parts of different diameter which may be moved vertically inside each other. In certain embodiments, a force transmission element (or rod) extends from a lifter through an outer chamber feedthrough and attaches to the substrate support 40 at a suitable point e.g. at the pedestal 49, pedestal leg or directly at the part 83. FIGS. 7 and 8 show two alternative lifters 73 and 73' which differ from each other in their position. The force transmission element 71 of the lifter 73 passes via the flanges 88 and 89 while the force transmission element 71' of the alternative lifter 73' passes via another feedthrough in the outer chamber 80 wall. In both cases, a contracted shape and extended shapes of the longitudinally extensional part 83 can be realized so as to provide different vertical positions of the substrate support 40 (or support table 48) to meet different requirements of different plasmas as to their optimal distance from substrate surface. FIG. 7 shows the part 83 in its contracted shape and FIG. 8 shows the part 83 in one of its extended shapes.

FIG. 9 shows a flow chart of a method for disassembling the substrate processing apparatus 100 for maintenance in accordance with certain embodiments.

In step 901, the reaction chamber assembly comprising the substrate support 40 is detached from the bottom structure 89 of the outer chamber 80. In certain embodiments, this also includes detaching the feedthrough part 44 from the bottom structure 89. In certain embodiment, the detaching step is implemented by releasing the fasteners 47 from the outside of the outer chamber 80.

In step 902, the wirings 43 including their plugs (released from the outside of the outer chamber 80) are moved via the bottom structure 89 into a reaction chamber side of the bottom structure via openings in the bottom structure 89.

In step 903, the reaction chamber assembly together with suspended wires 43 and their plugs is lifted upwards and moved away/removed from the apparatus 100 for maintenance.

FIG. 10 shows a flow chart of another method for disassembling the substrate processing apparatus 100 for maintenance in accordance with certain other embodiments. In these embodiments, only the substrate table 48 is detached from the apparatus.

In step 1001, the feedthrough part 44 is detached from the bottom structure 89. In certain embodiment, the detaching step is implemented by releasing the fasteners 47, from the outside of the outer chamber 80, if applicable. In certain embodiments, the feedthrough part 44 is also detached from the connecting flange 88, if applicable. In certain embodiment, this is achieved by releasing corresponding fasteners, e.g., fasteners 92, if applicable. In certain embodiments, the fasteners 92 are released from the vacuum chamber side of the bottom structure 89.

In step 1002, the wirings 43 including their plugs (released from the outside of the outer chamber 80) are moved via the bottom structure 89 into a reaction chamber side of the bottom structure 89 via openings in the bottom structure 89.

In steps 1003 and 1004, the wirings 43 including their plugs and the feedthrough part 44 are moved through the channel 45 in the pedestal 49 leg, and the substrate table 48 is lifted upwards and moved away from the apparatus 100 for maintenance, together with the wirings 43, their plugs, and the feedthrough part 44 that are hanging/suspended from the substrate table 48. In certain embodiments, the step 1004 comprises detaching the substrate table 48 from the pedestal 49 by a lifting movement (there may be associated fasteners that will be released preceding the step 1004 in certain embodiments (not shown)).

Without limiting the scope and interpretation of the patent claims, certain technical effects of one or more of the example embodiments disclosed herein are listed in the following. A technical effect is providing a way to guide wirings out from the vacuum. A further technical effect is a reduced need to clean the wirings. A further technical effect is ameliorated servicing aspects due to the possibility of disassembling reactor parts (e.g., reaction chamber package including the reaction chamber bowl-bellows-wafer table) from the apparatus, in particular through the lid of the apparatus, which lid is situated at the top. A further technical effect is providing an adjustable distance between plasma antennas and a substrate surface due to height-adjustable substrate holder pedestal legs, independent of the reaction chamber.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A substrate processing apparatus, comprising:
 a reaction chamber;
 an outer chamber at least partly surrounding the reaction chamber and forming an intermediate volume therebetween; and
 a substrate support within the reaction chamber, comprising a hollow inner volume,
  wherein the hollow inner volume and the intermediate volume are in fluid communication through a channel extending from the hollow inner volume to the intermediate volume,
  and wherein the channel houses wirings which wirings extend within the channel from the substrate support to the intermediate volume.

2. The apparatus of claim 1, wherein the wirings exit the outer chamber through at least one feedthrough at the bottom of the outer chamber.

3. The apparatus of claim 1, wherein at least one feedthrough part is detachably attached to a connection flange attached to an assembly comprising at least a lower part of the reaction chamber and the substrate support.

4. The apparatus of claim 3, wherein the connection flange is detachably attached to a bottom flange of the outer chamber.

5. The apparatus of claim 1, comprising an actuator configured to lower and raise the reaction chamber, and a longitudinally extensional tubular part in a reaction chamber exhaust line allowing a vertical movement.

6. The apparatus of claim 1, wherein the apparatus is configured to adjust a vertical position of the substrate support by extending a length of the channel.

7. The apparatus of claim 6, comprising an actuator configured to lower and raise a level of a substrate table of the substrate support by changing a longitudinal dimension of a longitudinally extensional part that forms part of the channel.

8. The apparatus of claim 1, comprising antennas for plasma formation positioned within the reaction chamber above the substrate support.

9. The apparatus of claim 8, comprising precursor pipes extending into spaces in between the antennas and further within the reaction chamber to discharge non-plasma gas at points downstream from the antennas.

10. A substrate processing apparatus, comprising:
 a reaction chamber;
 an outer chamber at least partly surrounding the reaction chamber and forming an intermediate volume therebetween; and
 a substrate support within the reaction chamber, comprising a hollow inner volume,
  wherein the hollow inner volume and the intermediate volume are in fluid communication through a channel extending from the hollow inner volume to the intermediate volume;
 an actuator configured to lower and raise the reaction chamber, and a longitudinally extensional tubular part in a reaction chamber exhaust line allowing a vertical movement; and
 wirings wound around the longitudinally extensional tubular part.

* * * * *